United States Patent
Buhl et al.

(10) Patent No.: US 11,181,830 B2
(45) Date of Patent: Nov. 23, 2021

(54) LITHOGRAPHIC APPARATUS AND METHOD OF CONTROLLING A LITHOGRAPHIC APPARATUS

(71) Applicant: Qoniac GmbH, Dresden (DE)

(72) Inventors: Stefan Buhl, Dresden (DE); Philip Groeger, Dresden (DE); Wansoo Kim, Dresden (DE)

(73) Assignee: Qoniac GmbH, Dresden (DE)

( * ) Notice: Subject to any disclaimer, the term of this patent is extended or adjusted under 35 U.S.C. 154(b) by 0 days.

(21) Appl. No.: 16/234,932

(22) Filed: Dec. 28, 2018

(65) Prior Publication Data

US 2020/0209762 A1 Jul. 2, 2020

(51) Int. Cl.
*G03F 7/20* (2006.01)
*H01L 21/027* (2006.01)

(52) U.S. Cl.
CPC ...... *G03F 7/70558* (2013.01); *G03F 7/70625* (2013.01); *G03F 7/70641* (2013.01); *H01L 21/0274* (2013.01)

(58) Field of Classification Search
CPC ............ G03F 7/70558; G03F 7/70625; G03F 7/70641; G03F 9/7026; G03F 7/2059; G03F 7/70333; G03F 7/70358; G03F 7/70716; G03F 9/7034; H01L 21/0274
See application file for complete search history.

(56) References Cited

U.S. PATENT DOCUMENTS

| | | | |
|---|---|---|---|
| 2003/0127607 A1* | 7/2003 | Van Der Veen | G03F 7/70983 250/492.22 |
| 2010/0302525 A1 | 12/2010 | Zimmerman | |
| 2016/0370711 A1 | 12/2016 | Schmitt-Weaver | |
| 2018/0210351 A1 | 7/2018 | Queens | |

(Continued)

FOREIGN PATENT DOCUMENTS

| | | | |
|---|---|---|---|
| JP | S6041223 A | 3/1985 | |
| JP | H0562875 A | 3/1993 | |

(Continued)

OTHER PUBLICATIONS

Y. J. Kim, et al., "Process margin improvement through fingerprint removal based on scanner leveling data,", Proc. of SPIE vol. 1014709-1 (2017).

(Continued)

*Primary Examiner* — Deoram Persaud
(74) *Attorney, Agent, or Firm* — Hodgson Russ LLP

(57) ABSTRACT

A Lithographic apparatus and method of controlling a lithographic process. A substrate is provided and a photosensitive layer is provided on a main surface of the substrate. The substrate includes a base section and a mesa section. In the base section the main surface is in a base plane. The mesa section protrudes from the base plane. A radiation beam scans the photosensitive layer. A local dose applied to a partial area of the photosensitive layer by the radiation beam includes a base dose component and a correction dose component. The correction dose component is a function of a distance between the partial area and a transition between (Continued)

the base section and the mesa section and at least partly compensates an effect of a defocus, which results from a height difference between the mesa section and the base section, on a critical dimension in the partial area.

18 Claims, 8 Drawing Sheets

(56) References Cited

U.S. PATENT DOCUMENTS

| | | | |
|---|---|---|---|
| 2018/0259858 A1* | 9/2018 | Chen | G03F 7/70633 |
| 2019/0302629 A1* | 10/2019 | Li | G03F 7/70558 |

FOREIGN PATENT DOCUMENTS

| | | |
|---|---|---|
| JP | H075675 A | 1/1995 |
| JP | H0715871 B2 | 2/1995 |
| JP | H07134395 A | 5/1995 |
| JP | H0887716 A | 4/1996 |
| JP | 2000315646 A | 11/2000 |
| JP | 2007250810 A | 9/2007 |
| JP | 2017509016 A | 3/2017 |
| JP | 2018519551 A | 7/2018 |
| KR | 20160106724 A | 9/2016 |
| TW | 200708888 A | 3/2007 |
| TW | 200941153 A | 10/2009 |
| TW | 201830162 A | 8/2018 |
| TW | 201830168 A | 8/2018 |
| TW | 201837978 A | 10/2018 |

OTHER PUBLICATIONS

JPO, Office Action for JP Application No. 2019-194252, dated Mar. 16, 2021.
TIPO, First Office Action for TW Application No. 108138211, dated Sep. 29, 2020 (see X/Y/A designations at p. 6).
TIPO, Second Office Action for TW Application No. 108138211, dated Feb. 8, 2021.
KIPO, Office Action for KR Application No. 10-2019-0162574, dated Mar. 4, 2021.

* cited by examiner

LITHOGRAPHIC APPARATUS AND METHOD OF CONTROLLING A LITHOGRAPHIC APPARATUS

BACKGROUND OF THE INVENTION

Field of the Invention

The present disclosure relates to a lithographic apparatus, in particular, to the control of a lithographic apparatus on the basis of substrate leveling data. The disclosure further relates to a method of manufacturing a semiconductor device, wherein the method uses a lithographic apparatus.

Brief Description of the Related Art

A lithographic apparatus projects a reticle pattern into a plurality of exposure fields of a semiconductor substrate, wherein the reticle pattern is imaged into a layer of radiation-sensitive material disposed on the semiconductor substrate. During exposure a radiation beam scans the pattern and the exposure field along a scan direction. A height sensor may measure distances between surface points of the semiconductor substrate and a reference plane and may output substrate leveling data, wherein the substrate leveling data includes information about the distances between the surface points and the reference plane. A focus control may use the substrate leveling data to compensate the effect of local topographical deviations by moving the semiconductor substrate along the radiation beam axis. In addition, dose correction techniques may reduce ACLV (Across-Chip Linewidth Variations) and AWLV (Across-Wafer Linewidth Variations).

There is a need for an exposure method and a lithographic apparatus that improve compensation of defocus effects caused by local topography variations.

SUMMARY OF THE INVENTION

An embodiment of the present application relates to an exposure method. A substrate is provided and a photosensitive layer is provided on a main surface of the substrate. The substrate includes a base section and a mesa section. In the base section the main surface is in a base plane. The mesa section protrudes from the base plane. A radiation beam scans the photosensitive layer. A local dose applied to a partial area of the photosensitive layer by the radiation beam includes a base dose component and a correction dose component. The correction dose component is a function of a distance between the partial area and a transition between the base section and the mesa section. The correction dose component at least partly compensates an effect of a defocus, which results from a height difference between the mesa section and the base section, on a critical dimension in the partial area.

Another embodiment of the present application relates to a lithographic apparatus with a substrate stage configured to hold a substrate with device-specific topology including a base section and a mesa section. A scanner unit is configured to scan a photosensitive layer formed on a main surface of a substrate, which is held by the substrate stage, with a radiation beam. A supplemental controller is configured to determine a correction dose component of a local dose applied by the radiation beam to a partial area of the photosensitive layer. The correction dose component is a function of a distance between the partial area and a transition between the base section and the mesa section. The correction dose component at least partly compensates an effect of a defocus that results from a height difference between the mesa section and the base section on a critical dimension in the partial area. A main controller is configured to control the local dose applied by the radiation beam to the partial area, wherein the main controller is configured to obtain the local dose from the correction dose component and a base dose component.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the embodiments and are incorporated in and constitute a part of this specification. The drawings illustrate embodiments of an exposure method and a lithographic apparatus and together with the description serve to explain principles of the embodiments. Further embodiments are described in the following detailed description and the claims.

DETAILED DESCRIPTION

Figure 1:
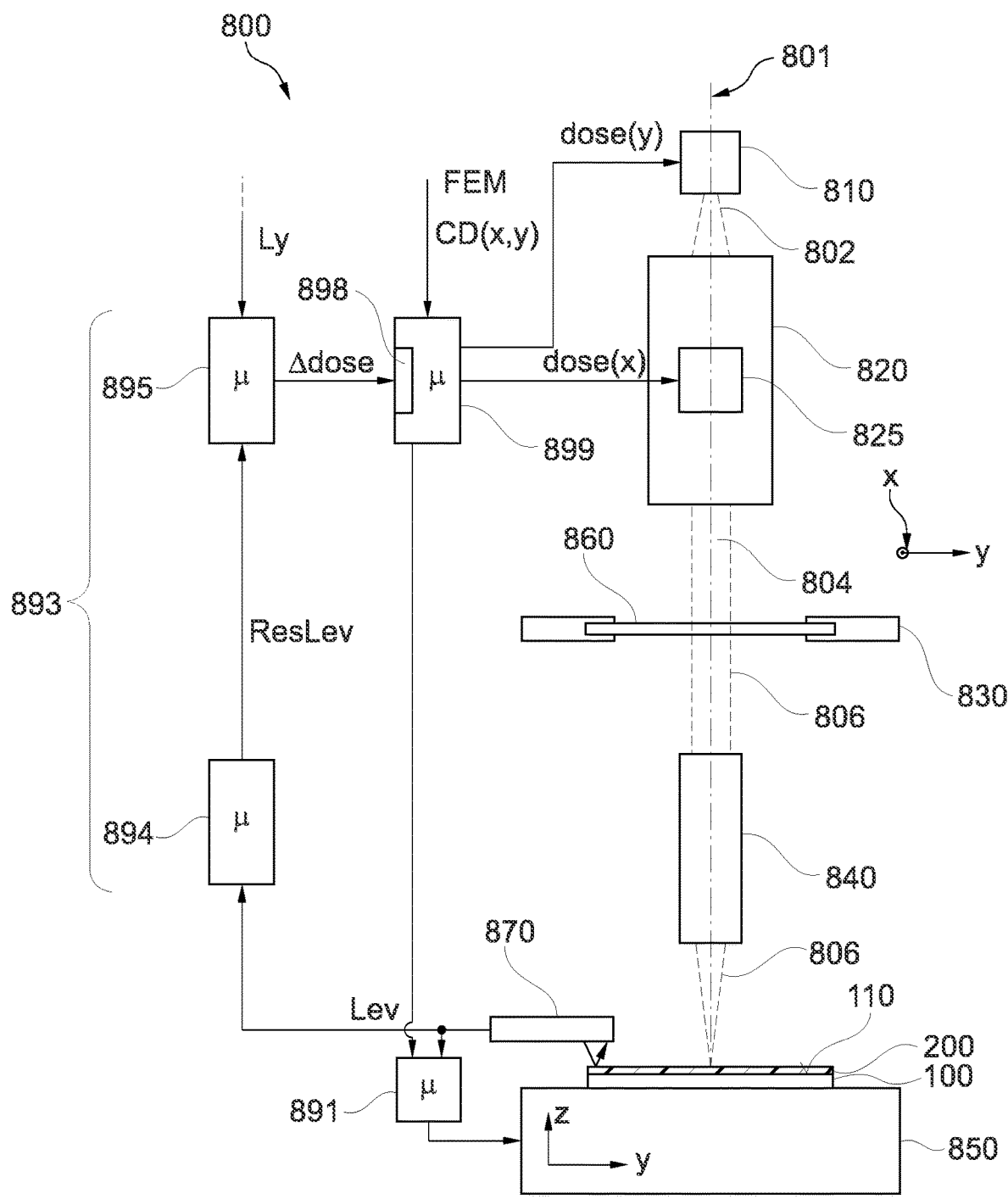
FIG. 1 shows a schematic block diagram of a lithographic apparatus according to an embodiment.

In the following detailed description, reference is made to the accompanying drawings, which form a part hereof and in which are shown by way of illustrations specific embodiments in which the embodiments may be practiced. It is to be understood that other embodiments may be utilized and structural or logical changes may be made without departing from the scope of the present disclosure. For example, features illustrated or described for one embodiment can be used on or in conjunction with other embodiments to yield yet a further embodiment. It is intended that the present disclosure includes such modifications and variations. The examples are described using specific language, which should not be construed as limiting the scope of the appending claims. The drawings are not scaled and are for illustrative purposes only. Corresponding elements are designated by the same reference signs in the different drawings if not stated otherwise.

The terms "having", "containing", "including", "comprising" and the like are open, and the terms indicate the presence of stated structures, elements or features but do not preclude additional elements or features. The articles "a", "an" and "the" are intended to include the plural as well as the singular, unless the context clearly indicates otherwise.

According to an embodiment of the present disclosure an exposure method includes providing a substrate with a main surface and a photosensitive layer on the substrate main surface. The substrate may be a thin disc that includes semiconducting material. For example, the substrate may be a semiconductor wafer, a glass substrate with semiconductor elements formed on a process surface of the glass substrate or an SOI (silicon-on-insulator) wafer. The photosensitive layer includes a photoactive component that can be activated or deactivated in selected portions of the photosensitive layer by exposure to a radiation beam.

The substrate includes a base section and mesa sections. In the base section, a first section of the main surface is in a base plane or locally deviates from the base plane up to a degree inherently resulting from preceding processes in a semiconductor factory, wherein side effects such as wafer bowing, particle contamination and process imperfections of planarizing processes may cause local deviations of the substrate main surface from the base plane. For example, a maximum deviation of the first main surface section from the base plane may be at most 20 nm.

Directions in the base plane or parallel to the base plane are lateral (horizontal) directions. The surface normal to the base plane defines a vertical direction.

The mesa sections protrude from the base plane. A top surface of the mesa sections is parallel to the base plane or may locally deviate from a plane parallel to the base plane for the same reasons and to the same degree as described for the deviations of the first main surface section from the base plane in the base section. The top surface of the mesa sections forms a second main surface section.

A mesa height of the mesa sections above the base plane is significantly greater than the maximum deviation of the first main surface section from the base plane caused by side effects. The mesa sections may have the same mesa height above the base plane or different groups of mesa sections may have different mesa heights above the base plane. For example, the mesa height may be in a range from 50 nm to 10 µm, e.g., from 50 nm to 500 nm.

Transitions between the base section and the mesa sections, in other words, the slopes of the mesa sections, may be comparatively steep, wherein a horizontal extension of the slope is smaller than the mesa height, e.g., at most 10% of the mesa height. According to other embodiments the transitions may be comparatively smooth or each transition may include a plurality of steps.

The photosensitive layer may cover the top surface of the mesa sections and may fill gaps between neighboring mesa sections. The thickness of the photosensitive layer above the base section may be the sum of the thickness of the photosensitive layer in the mesa sections and the mesa height. The photosensitive layer may be a spin-on liquid photoresist (LPR).

In an alternative, the photosensitive layer may cover the main surface as conformal layer of uniform thickness. The photosensitive layer may exhibit marginal thickness variations along edges, steps or other elements of the substrate, wherein the magnitude of the thickness variations is low compared to a mean thickness of the conformal layer. The photosensitive layer may be an electrophoretic photoresist (EPR) and may be deposited by a combination of electrophoresis, electrolysis and electro-osmosis.

In a further alternative, a thickness of the photosensitive layer may change as a function of the distance to transitions between the base section and the mesa sections, wherein a maximum thickness of the photosensitive layer above the first mesa section is smaller than the sum of the mesa height and the maximum thickness of the photosensitive layer above the mesa sections.

A radiation beam scans the photosensitive layer along a scan direction (y-direction). The scanning process includes a relative movement between the radiation beam and the substrate along the scan direction. Scanning the photosensitive layer with the radiation beam may include moving the radiation beam across a stationary substrate, moving the substrate relative to a stationary radiation beam or moving both the radiation beam and the substrate along the scan direction. The radiation beam may cross transitions between the base section and the mesa sections. For example, the radiation beam may cross the transitions orthogonally. Alternatively or in addition, the radiation beam may scan the photosensitive layer parallel to a transition, wherein the radiation beam scans portions of the photosensitive layer on both sides of the transition.

A local dose, which the radiation beam applies to a partial area of the photosensitive layer, includes a base dose component and a correction dose component. The correction dose component is controlled as a function of a distance between the partial area and the preceding transition and/or as a function of a distance between the radiation beam and the subsequent transition in the scan direction in a way that the correction dose component at least partly compensates an effect of defocus, which results from a height difference between the mesa section and the base section, on a critical dimension in the partial area.

For example, a pre-adjustment routine, which may use, by way of example, a focus-exposure matrix (FEM), assigns a base dose component and a base focus to a first position in an exposure field, wherein at the first position the exposure field includes a first feature with a first CD and wherein the first position has a first distance to a closest transition between the base section and a mesa section. At a second position, which has a second, different distance to the transition, the exposure field includes a second feature with a second CD. At the second position, the radiation beam applies a dose that may result from increasing or decreasing the base dose component by a correction dose component. The correction dose component includes a layout-topography-related term that may be a function of the first and second distances.

The correction dose component may further include a CD-related term that may take into account different effects of the same dose difference and/or the same defocus on different sorts of CDs. The CD-related term may be obsolete if the first CD and the second CD are identical in shape, size and environment.

Alternatively or in addition, the correction dose component may include a resist-related term that takes into account the effect of different thickness of the photosensitive layer above the first and second positions. The resist-related term may be obsolete in case of a highly conformal photosensitive layer.

The applied correction dose component may change each time the radiation beam approaches, crosses and/or departs from a transition. The applied correction dose component may remain unchanged, when the radiation beam scans parallel to the transition and the critical dimension does not change. The dose variation is selected such that the dose variation at least partly compensates the effect of a change of a focus position of the radiation beam on a critical dimension in the base section and/or in the mesa sections, wherein the change of the (de)focus is induced by the mesa height and wherein the extend of the change may depend on physical constraints of a lithographic apparatus and/or properties of the photosensitive layer.

The critical dimension (CD) may concern any feature characteristic of a critical resist feature. The critical resist feature characteristic may include physical dimensions, such as the diameter of a circular resist feature, the lengths of short axes and long axes of non-circular resist features, the line width of a stripe-shaped resist feature, the width of spaces between resist features, sidewall angles of resist features, areas of resist features and other properties such as line edge roughness of resist features, by way of example.

CD/focus data, e.g., CD/focus maps and/or CD/focus models, CD/dose data, e.g., CD/dose maps and/or CD/dose models and/or CD/focus/dose maps and CD/focus/dose models may describe the effect of focus and dose variations on at least one critical dimension of a resist feature. Conventionally, dose and exposure parameters may be selected in a way to obtain process windows as wide as possible for the most critical dimensions. In addition, for substrates with flat main surface, substrate leveling data describing process-induced height deviations of the main surface from a reference plane may be used to control a distance between the reference plane and an aperture of a projection system in a way that such deviations are compensated. For substrates with device-specific topography, the device-specific topography can be filtered out to reduce the effect of defocus errors, e.g., moving average error, dynamic error, and/or moving focus on both sides of a transition. Device-specific topography is to be understood as generic term indicating the presence of distinct protrusions and grooves in a substrate surface.

The present embodiment facilitates at least partial compensation of the effect, which an inherent defocus caused by device-specific topography has on critical dimensions.

The control of the dose may use CD/focus data to obtain information about a change of the CD caused by the shift of the focus induced by the mesa height. The control of the dose may further use CD/dose data to obtain a dose that at least partly compensates the CD change caused by the focus shift induced by the mesa height.

The lithographic apparatus 800 illustrated in FIG. 1 includes a radiation source 810 that emits pulses of monochromatic radiation 802 at a wavelength of, for example, 248 nm or 193 nm. The applicable dose is a function of the pulse rate. The pulse rate of the monochromatic radiation 802 may be controllable. By controlling the pulse rate the applied dose may change along the y-direction.

An illumination unit 820 may filter and collimate the emitted monochromatic radiation 802 and may form and condition an illumination beam 804, wherein the illumination beam 804 has a defined lateral intensity distribution in a cross-section orthogonal to a beam axis 801. A slit-shaped aperture of the illumination unit 820 may define a rectangular cross-section of the illumination beam 804.

The illumination unit 820 may include a controllable adjustment unit 825. The adjustment unit 825 may temporally modulate the intensity distribution in the illumination beam 804. For example, the adjustment unit 825 may modulate the intensity in the illumination beam 804 predominantly or exclusively along an x-direction orthogonal to the y-direction.

The illumination beam 804 may impinge onto a reticle 860, which may be fixed in a mask frame 830. The mask frame 830 and the illumination beam 804 are moveable against each other along the y-direction. For example, the illumination beam 804 may be stationary and the mask frame 830 moves along the scan direction and anti-parallel to the scan direction.

The reticle 860 may be a transparent reticle that includes a reticle pattern with transparent portions and opaque portions. The illumination beam 804 has a wavelength of at least 126 nm, passes the transparent portions and is blocked at opaque portions of the reticle pattern. The reticle pattern may include one, two, four or more device patterns, wherein each device pattern contains the patterning information of a patterning plane of a complete semiconductor device. The stripe length of the illumination beam may be sufficient to extend across at least one device pattern of the reticle pattern.

According to other embodiments (not shown), the reticle 860 may be a reflective mask that includes a reticle pattern with reflective portions and absorbing portions. The illumination beam 804 has a wavelength of at most 13.5 nm and impinges on the reticle at an angle significantly deviating from the surface normal onto the reticle. The illumination beam is reflected at the reflective portions and is absorbed in the absorbing portions of the reticle pattern.

The reticle pattern modulates the lateral intensity distribution of the illumination beam 804. The modulated illumination beam forms a radiation beam 806 that contains the information about the reticle pattern, wherein the reticle pattern is encoded in lateral variations of the intensity distribution in the radiation beam 806.

A projection system 840 may direct the radiation beam 806 onto a main surface 110 of a substrate 100. A photosensitive layer 200 covers the main surface 110. The radiation beam 806 projects the reticle pattern into the photosensitive layer 200. The main surface 110 of the substrate 100 may be virtually divided into a plurality of exposure fields that may be arranged in rows and columns. The exposure fields are scanned one after another. During exposure, the scanned exposure field is positioned at an exposure position.

During exposure, the substrate 100 may be fixed on a substrate stage 850. At least one of the substrate stage 850 and the projection system 840 may be movable, such that the radiation beam 860 scans the exposure field at the exposure position along a linear scan direction (y direction) and/or anti-parallel to the scan direction. The radiation beam 806 may scan each exposure field once or several times at uniform scan speed. The exposure field has a field length along the y direction and a field width along the x direction (orthogonal to the scan direction).

After completion of the exposure of the exposure field, the substrate stage 850 may move in at least one lateral direction, wherein another exposure field is placed at the exposure position.

An aperture of the projection system 840 may be stripe-shaped. A cross-sectional area of the radiation beam 806 may be a rectangular strip with a strip width along the y direction (scan direction) and a strip length along the x direction (orthogonal to scan direction). The strip width may be in the range of several hundred micrometers to few millimeters. The strip length is at least as long as a field width of the exposure field and may be in the range from several millimeters up to several centimeters.

Prior to exposure, a level sensor unit 870 may scan the substrate main surface 110 to obtain substrate leveling data. The substrate leveling data may represent a height map that describes local deviations of the main surface 110 from a reference plane as a function of planar coordinates, e.g., as a function of x-coordinates and y-coordinates. A leveling controller 891 may use the substrate leveling data to control a movement of the substrate stage 850 along the vertical direction (z-direction) in a way such that process-induced height deviations of the substrate main surface 110 from the reference plane are at least partially compensated.

A main controller 899 holds exposure information that may include predetermined pairs of dose/focus values. At exposure with the predetermined dose/focus values, the radiation beam images preselected features with critical dimensions into a photosensitive layer, which covers a substrate without significant device-specific topography, at a sufficient wide process window. For example, at exposure with the predetermined dose/focus values the respective process windows may have a maximum width. In other words, at exposure with the predetermined dose/focus values deviations from the target values for dose and/or focus have the least adverse impact on the preselected features.

The exposure information may be obtained at a former stage from an FEM wafer, wherein a feature of interest is imaged into exposure fields of the FEM wafer at different combinations of dose and focus.

In addition, the predetermined dose/focus values may be selected to compensate for inter-field deviations. For example, imperfections of the lithographic apparatus may result in different imaging properties among the exposure fields, which may be compensated by changing focus and/or dose as a function of the x coordinates and the y coordinates of the exposure field on the main surface. Alternatively or in addition, the predetermined dose/focus values may be selected to compensate for inter-field deviations induced by processes applied to the substrate before or after the exposure, e.g., etch processes with etch rates depending on a distance to the substrate center.

In addition or alternatively, the predetermined dose/focus values may be selected to compensate for intra-field deviations. For example, uncorrected illumination non-uniformities, mask aberrations and projection lens aberrations may result in different imaging properties within the exposure field that may be compensated by changing the predetermined focus and/or dose values as a function of the x coordinates and the y coordinates within the exposure field.

The predetermined dose values define a base dose component of a local exposure dose.

A supplemental controller 893 may use substrate leveling data and/or device-specific layout data for assembling a correction dose component of the local dose applied by the radiation beam to the partial area, wherein the correction dose component at least partly compensates the effect of a remnant defocus caused by the height difference between the mesa section and the base section, on a critical feature in the partial area of the photosensitive layer 200. The compensation dose component may have a positive or negative value and may be added to the base dose component to obtain the total local dose.

The supplemental controller 893 may include a first supplemental unit 894 and a second supplemental unit 895. The first supplemental unit 894 may provide residual leveling error data describing a residual defocus, e.g., a moving focus, for surface points of the substrate main surface 110. For example, the first supplemental unit 894 may receive the substrate leveling data from the level sensor unit 870 and may possess information about parameters of the movement of the substrate table 850 in response to the actual substrate leveling data, about slit width and about scan speed. The residual leveling error data contains information about a residual portion of the deviation from the reference plane, wherein the residual portion is not compensated by the leveling control applied by the leveling controller 891.

The second supplemental unit 895 may assemble a supplemental dose map. The supplemental dose map may include position-dependent correction dose components that at least partly compensate a residual focus error, e.g., a moving average error or a moving focus. For example, the second supplemental unit 895 may receive external layout topography data describing a device-specific topography exposed in a current lithography process. The layout topography data may include, e.g., a combination of layout data of the semiconductor device and information about a height difference between neighboring layout features. Alternatively or in addition, the layout topography data may include data from process tools at which the semiconductor substrate 100 has been processed prior to being mounted on the substrate stage 850 or from measurement devices that obtain information about position and height of 3D features on the substrate 800.

Alternatively or in addition, the second supplemental unit 895 may receive the residual leveling error data from the first supplemental unit 894. The first supplemental unit 894 may be absent if the second supplemental unit 895 does not use residual leveling error data.

Each of the first and the second supplemental units 894, 895 may be realized as computer program executed on a server distant to the lithographic apparatus 800 or may be part of a program code executed by a controller or server, wherein the controller or server may be data-connected with or integrated in the lithographic apparatus 800.

The supplemental controller 893 may transmit the supplemental dose map to the main controller 899. The main controller 899 may receive the supplemental dose map at a data interface 898 and may combine the supplemental dose map with a main dose map. The supplemental dose map provides correction dose values that compensate the effects of residual defocus caused by intra-field device-specific topography.

Figure 2:
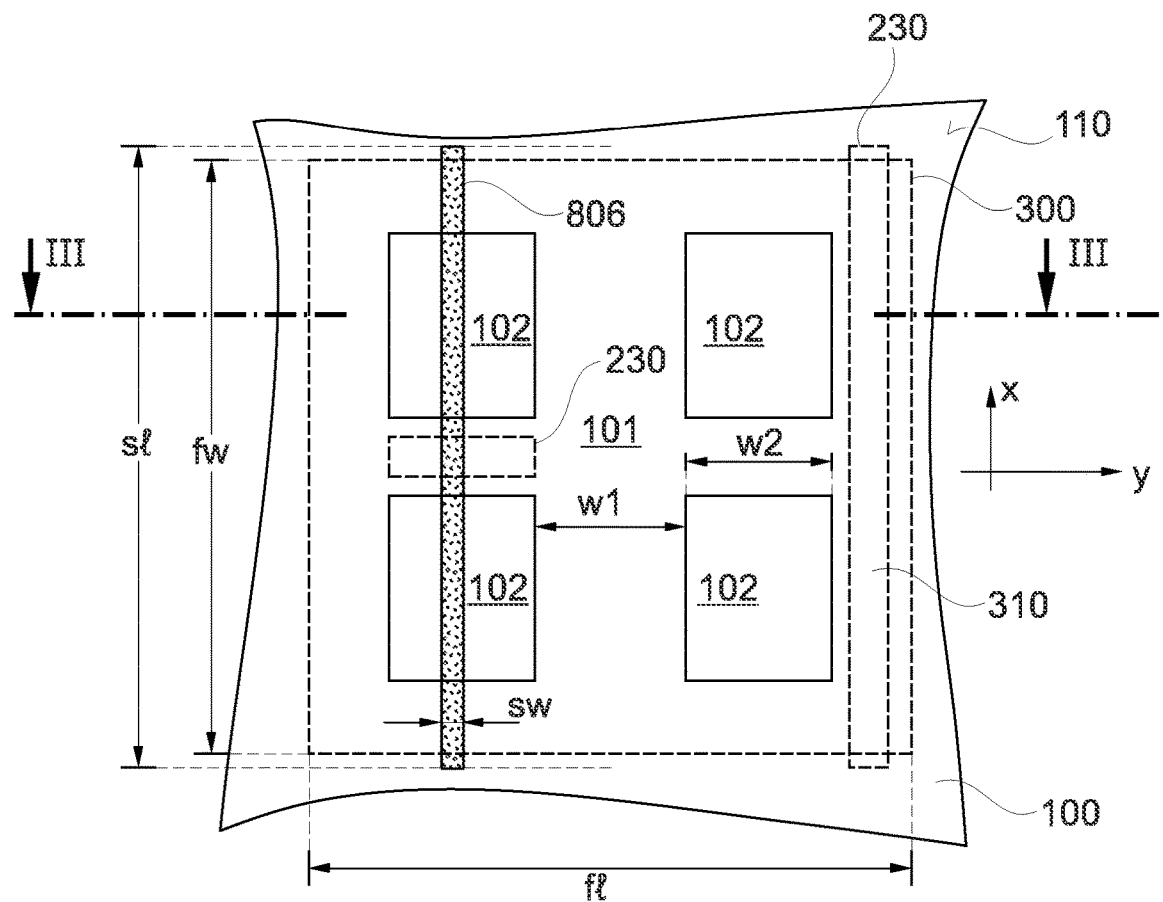
FIG. 2 shows a plan view of an exposure field portion with device-specific topography according to an embodiment.

FIG. 2 shows a radiation beam 806 scanning an exposure field 300 of a substrate main surface 110 along a scan direction (y direction). In the focal plane the radiation beam 806 has a stripe-shaped cross-section (slit), wherein the slit has a slit width sw along the y direction and a slit length sl along the x direction, which is the lateral direction orthogonal to the y-direction.

The slit width sw may be in the range of some hundred micrometers to some few millimeters, e.g., about 3.25 mm or 4.2 mm. The slit length sl is equal to or greater than a field width fw of the exposure field 300, wherein the field width fw may be several millimeters, e.g., about 26 mm. A field length fl of the exposure field 300 may be within the same order of magnitude, e.g., up to 33 mm.

Within the exposure field 300 the substrate 100 may include one, two, four or more device portions 310 with identical use patterns. For simplicity, FIG. 2 shows an exposure field 300 with one device portion 310. The device portion 310 includes a base section 101 and four mesa sections 102.

The radiation beam 806 scans the main surface 110 along the y-direction. A lateral width of the radiation beam 806 tapers from an aperture width in the plane of an opening of a projection unit 840 of FIG. 1 to approximately 3 mm to 4.5 mm in the focal plane. On top of the mesa sections 102 and along the y-direction the radiation beam 806 is narrower than the mesa sections 102 and narrower than a narrowest gap between neighboring mesa sections 102.

The mesa width w2 along the y-direction may be at least 100 µm, e.g., at least 500 µm. The gap width w1 may be at least 100 µm, e.g., at least 500 µm. A step height d0 of the mesa sections 102 with reference to the base plane 105 may be in a range from 50 nm to 200 nm, by way of example.

The applied local dose may be varied in partial areas 230 of a photosensitive layer covering the substrate main surface 110. A first partial area 230 on the right hand side has an extension along the x-direction equal to the slit length sl. The dose applied in the first partial area 230 may be modified by changing the pulse rate of the radiation. A second partial area 230 on the left hand side has an extension along the x-direction which is smaller than the slit length sl. The dose applied in the second partial area 230 may be modified by controlling the adjustment unit 825 of FIG. 1.

Figure 3A:
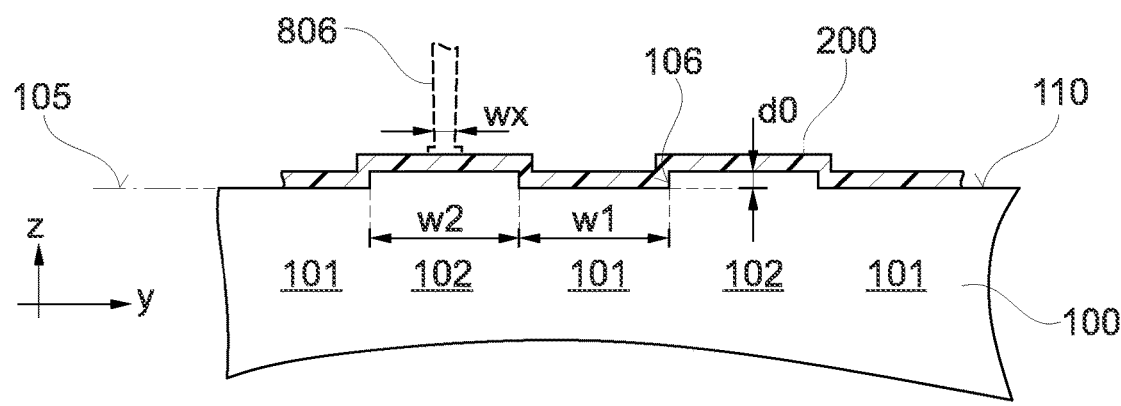
FIG. 3A shows a cross-sectional view of a substrate with device-specific topography covered with an EPR (electrophoretic photoresist) layer according to an embodiment.
Figure 3B:
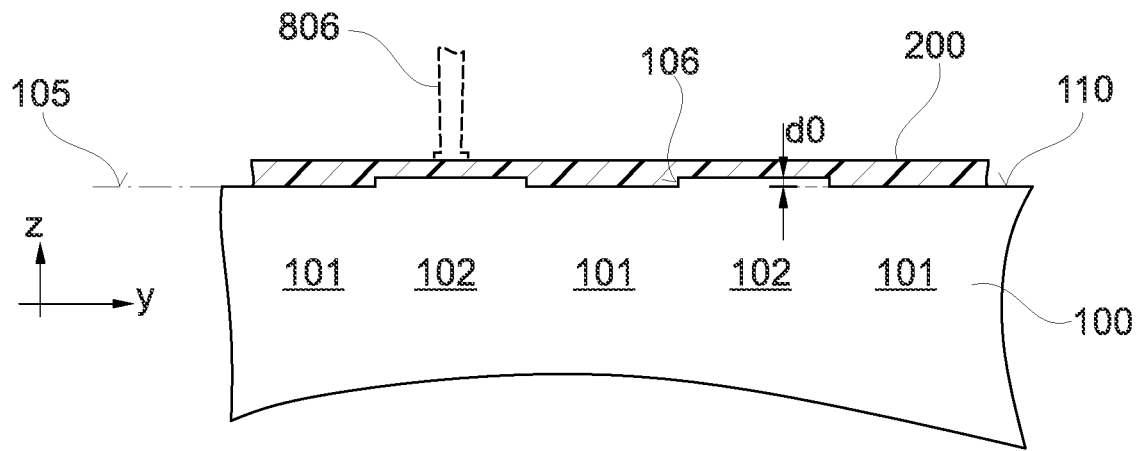
FIG. 3B shows a cross-sectional view of a substrate with device-specific topography covered with an LPR (spin-on liquid photoresist) layer according to another embodiment.
Figure 3C:
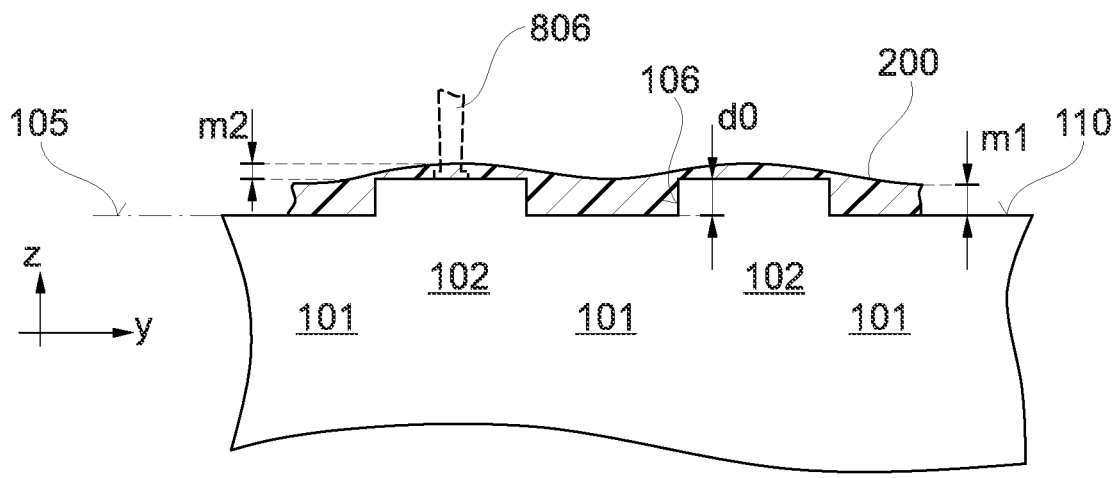
FIG. 3C shows a cross-sectional view of a substrate with device-specific topography covered with a further type of photosensitive layer according to a further embodiment.

In the cross-sections of FIGS. 3A-3C, a photosensitive layer 200 covers a main surface 110 of the substrate 100 of FIG. 2. A first section of the main surface 110 in the base section 101 may be in a base plane 105 or may be approximately in the base plane, wherein process imperfections, particles, substrate edge effects and/or wafer bowing may be the source of marginal local deviations of the main surface 110 from the base plane 105. A second section of the main surface 110 may include the top surfaces of the mesa sections 102, which may be coplanar with a plane parallel to the base plane 105 or which may be approximately coplanar with a plane parallel to the base plane, wherein process imperfections, particles, substrate edge effects and/or wafer bowing may be the source of marginal local deviations of the top surfaces of the mesa sections 102 from a plane parallel to the base plane.

In FIG. 3A the photosensitive layer 200 is a conformal layer. For example, the photosensitive layer 200 may include an EPR. Typically, the radiation beam 806 focuses in a focal plane, which approximately is in or close to the vertical center of the photosensitive layer 200. Without leveling control, the focal plane drifts out of the center of the photosensitive layer 200 by the step height d0, when the radiation beam 806 passes a transition 106 between the base section 101 and a mesa section 102.

The lithographic apparatus of FIG. 1 may compensate the vertical shift of the photosensitive layer 200 with respect to the focal plane by an appropriate change of the applied dose, e.g., by reducing or increasing the dose.

FIG. 3B shows a photosensitive layer 200 that includes an LPR. After a drying step, the photosensitive layer 200 may cover the mesa sections 102 and may completely fill gaps between neighboring mesa sections 102. An exposed surface of the photosensitive layer 200 may be planar or approximately planar with shallow projections above the mesa sections 102. Without leveling control, also in this case the focal plane drifts out of the center of the photosensitive layer 200 by the step height d0, when the radiation beam 806 passes a transition 106 between the base section 101 and a mesa section 102. A correction dose component of the local dose applied by a lithographic apparatus according to the embodiments includes a layout-topography-related term that takes into account a defocus error caused by the transition. The correction dose component may also include a resist-related term that takes into account the different exposure conditions for the portions of the photosensitive layer 200 above the mesa sections 102 and for the portions above the base section 101.

In FIG. 3C the thickness of the photosensitive layer 200 changes as a function of a distance to the transitions 106 between the base section 101 and the mesa sections 102, wherein a minimum thickness m1 of the photosensitive layer 200 above the base section 101 is smaller than the sum of the step height d0 and the maximum thickness m2 of the photosensitive layer 200 above the mesa sections 102 and wherein the minimum thickness m1 above the base section 101 is greater than the maximum thickness m2 above the mesa sections 102. The correction dose component may include a resist-related term that takes into account the different exposure conditions for the portions of the photosensitive layer 200 above the mesa sections 102 and for the portions above the base section 101 as a function of a distance to the transition 106.

Figure 4A:
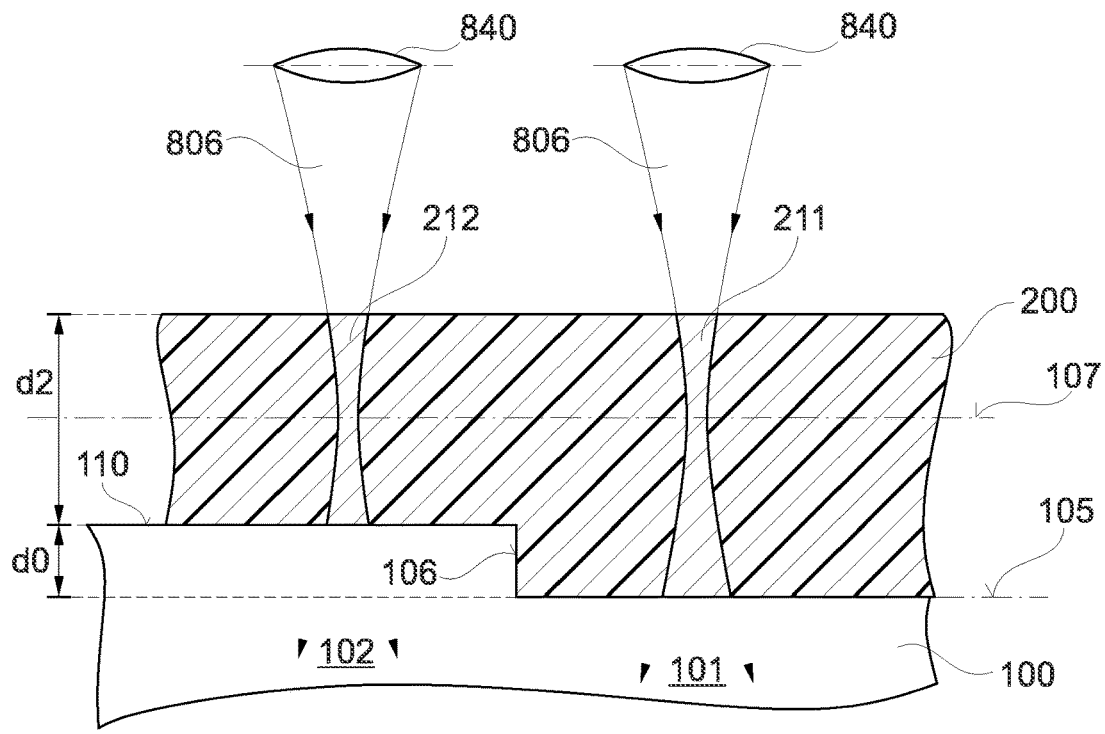
FIGS. 4A-4B show cross-sectional views of substrates with device-specific topography covered with an LPR layer for discussing effects of the embodiments.
Figure 4B:
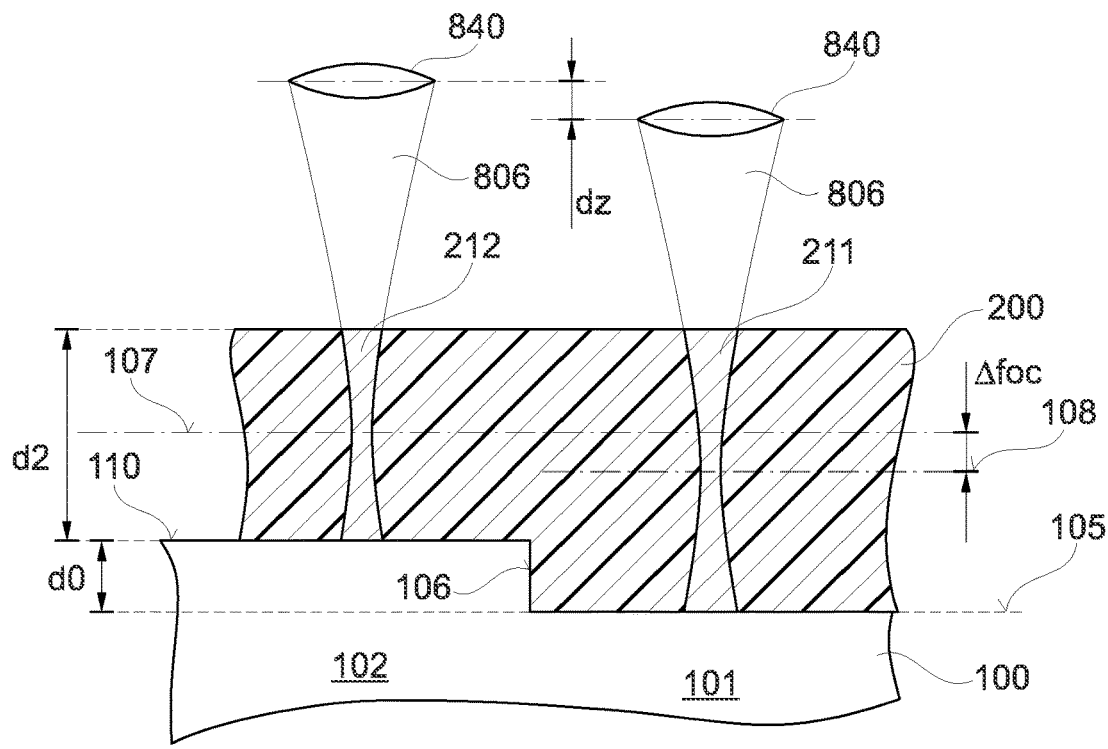

FIGS. 4A and 4B illustrate effects of a shift of a vertical center of a photosensitive layer 200 out of a focal plane 107, in the case that the photosensitive layer 200 contains an LPR and covers a main surface 110 of a substrate 100 with device-specific topography. A thickness d2 of the photosensitive layer 200 above the mesa sections 102 may be greater than the step height d0.

In FIG. 4A the leveling control does not respond to the transition 106 from the mesa section 102 to the base section 101. The focal plane 107 remains at the same distance with reference to the reference plane 105. A first exposed resist portion 212 above the mesa section 102 may taper with decreasing distance to the focal plane 107 both in the resist portion above the focal plane and in the resist portion below the focal plane. A second exposed resist portion 211 above the base section 101 may be more asymmetric with respect to the focal plane 107 and below the focal plane 107 the taper may be larger. A mean width of the second exposed resist portion 211 may be greater than the mean width of the first exposed resist portion 211. In the exposed resist portions 211, 212 a photoactive component contained in the photosensitive layer 200 is activated or deactivated. After development, the lateral extensions of resist features formed from the exposed resist portions 211, 212 may deviate from each other.

In FIG. 4B the leveling control responds to the transition 106 from the mesa section 102 to the base section 101 by a movement of the substrate 100 along the z-direction by dz=d0/2. The second exposed resist portion 211 may be more symmetric with respect to the shifted focal plane 108 than the second exposed resist portion 211 of FIG. 4A. But, the greater thickness of the photosensitive layer 200 above the base section 101 may affect the mean width of the second exposed portion 211, which may be wider than the first exposed resist portion 212.

A critical dimension defined by the second exposed resist portion may depend on the shape of the second exposed resist portion 211 that in turn depends on properties of the resist material like sensitivity, composition and layer thickness. A look-up table or a resist model may assign, for a certain resist material and for a certain type of CD, a resist-related term of a dose correction, wherein the resist-related term compensates CD variations that result from different resist thickness.

In FIGS. 3A-4B the mesa sections 102 introduce a device-specific topography. The device-specific topography results in a defocus error. In the absence of an appropriate focus correction, the defocus error may result in a change of a critical dimension. The amount of the change may depend on parameters of the lithographic apparatus, e.g., strip width and/or scan speed and may depend as well on parameters of the photosensitive layer, e.g., a local thickness variation of the photosensitive layer. The lithographic apparatus 800 of FIG. 1 compensates the effect of the defocus error caused by the step height d0 by a positive or negative compensation dose added to the base dose component. The compensation dose may include a layout-topography-related term and may further include a resist-related term.

FIGS. 5A-5E refer to topography-related focus errors and intra-field dose correction for compensating focus errors caused by device-specific topography for the case that device-specific topography is not filtered out for leveling control. The zero point of the y coordinate may be the position of any arbitrary point of the exposure field, e.g., at the edge of the exposure field or at the edge of a device region.

Figure 5A:
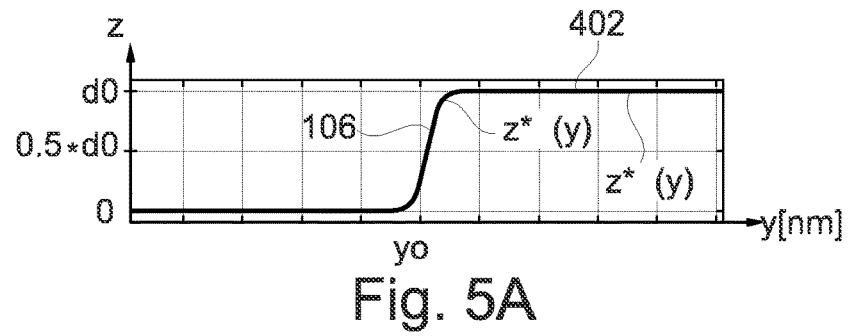
FIGS. 5A-5E show schematic diagrams for illustrating focus and dose control for substrates with device-specific topography according to embodiments with active leveling control responsive to device-specific topography.

FIG. 5A shows a surface line 402 of a substrate main surface, wherein the surface line 402 is given by a function $z^*(y)$. The surface line 402 indicates a steep transition 106 with a vertical step height d0 symmetric to $y=y_0$ in the main surface. If the leveling control is activated, the leveling control seeks to compensate the transition 106 by triggering a vertical compensation movement of the substrate table 850 of FIG. 1. The compensation movement changes the distance between the substrate table 850 and the projection system 840 of FIG. 1. For example, the compensation movement may increase the distance between substrate table 850 and the projection system, where the radiation beam 806 passes a transition 106 from a base section to a mesa section of the substrate 100 of FIG. 1.

Figure 5B:
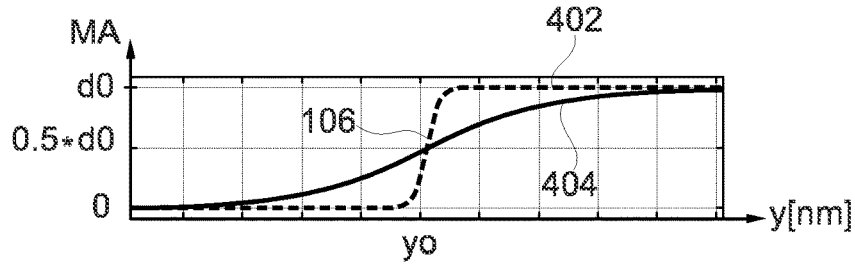

In FIG. 5B line 404 shows a moving average focus position MA(y) resulting from the compensation movement, which the substrate table 850 of FIG. 1 carries out in response to the transition 106 under level control. MA(y) indicates the average of the focus values that a point on the main surface sees during a scan, i.e., during one pass of the radiation beam. In other words, the leveling control aims at compensating the transition 106 in FIG. 5A by a shift of the substrate along the z-axis in a direction opposite to the transition 106 in FIG. 5A. Physical and technical constraints of the leveling control, the finite scan speed and the only finitely small strip width of the radiation beam result in that the slope of line 404 is less steep than the slope of line 402.

In addition, leveling control may be active for surface deviations with a lower spatial frequency than the device-specific topography such that lines 402, 404 may show a further slight inclination or a slight declination for the illustrated range of y.

Figure 5C:
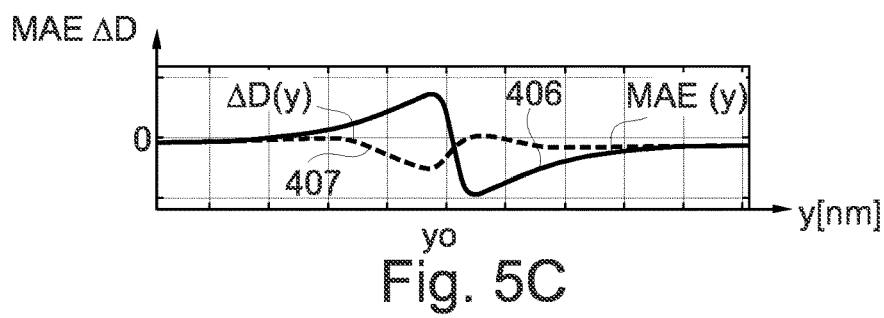

In FIG. 5C line 406 shows a moving average error MAE(y) that is a function of the difference between $z^*(y)$ and MA(y). The MAE(y) may induce a CD variation that depends on the difference $y-y_0$. The relationship between MAE(y) and a CD variation may be described by a model and model coefficients and/or a look-up table assigning MAE values to CD values or $\Delta$CD values. In addition, a further model or look-up table may relate $\Delta$CD values and dose correction values. Alternatively, a model or look-up table may directly relate MAE values and dose correction values.

Line 407 shows an example for a correction dose component $\Delta D(y)$ obtained directly or via a CD variation from the MAE(y). In the illustrated embodiment $\Delta D(y)$ is point-symmetric with respect to $\Delta D(y_0)$ for illustration only. In general the correction dose component $\Delta D(y)$ may show no symmetry at all with respect to $\Delta D(y_0)$.

Figure 5D:
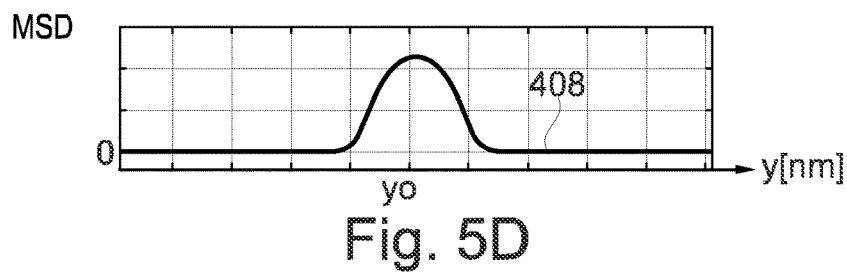

In FIG. 5D line 408 shows a dynamic error MSD(y) which essentially is the moving standard deviation of MAE(y).

Figure 5E:
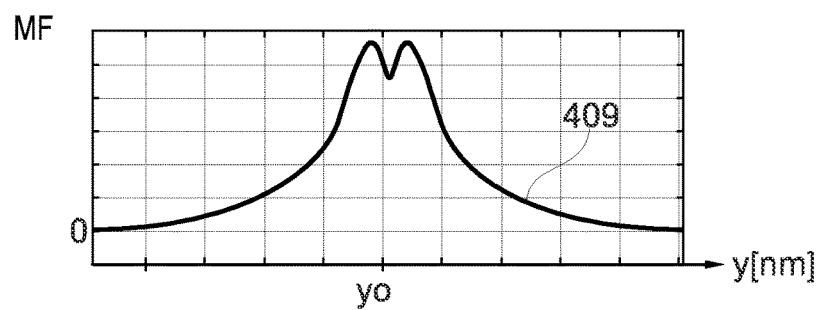

In FIG. 5E line 409 shows a total moving error or moving focus MF(y) obtained from the square root of the sum of $MSD^2(y)$ and $MAE^2(y)$. Depending on details of the application, e.g., resist properties and resist thickness distribution, MSD(y) and/or MF(y) may contain more valuable information for CD control than the MAE(y) and the method may select the correction dose component from models relating MSD and/or MF with CD variations and/or compensation doses.

FIGS. 6A-6E illustrate topography-related focus errors and intra-field dose correction for compensating focus errors caused by device-specific topography for the case that device-specific topography is filtered out and not taken into account for leveling control.

Figure 6A:
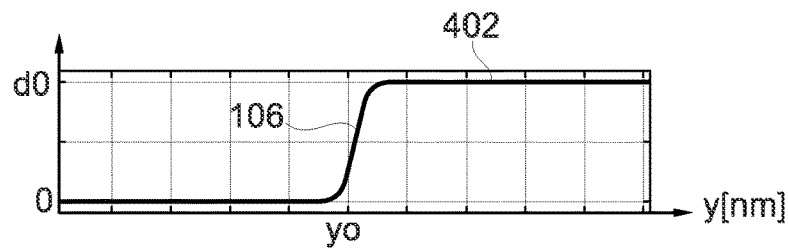
FIGS. 6A-6E show schematic diagrams for illustrating focus and dose control for substrates with device-specific topography according to embodiments with leveling control omitted for device-specific topography.

FIG. 6A shows a surface line 402 given by a function $z^*(y)$ and including a steep transition 106 with a vertical step height d0 symmetric to $y=y_0$ in the main surface. Since the leveling control is de-activated for the transition 106, the transition 106 does not trigger a compensation movement of the substrate table. Instead, the substrate table is held at a constant position that may correspond to a virtual plane at d0/2.

Figure 6B:
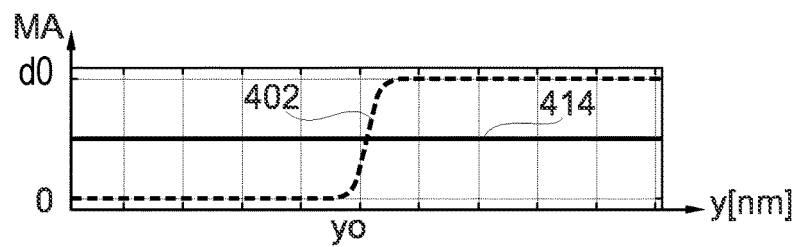

In FIG. 6B line 414 shows the corresponding moving average focus position MA(y), which is the average of the focus values that a point on the main surface sees during a scan. Since the substrate stage does not move, the focal plane is the same at both sides of the transition 106.

Again, leveling control may be active for surface deviations with a lower spatial frequency than the device-specific topography such that line 414 may show a further slight inclination or a slight declination for the illustrated range of y.

Figure 6C:
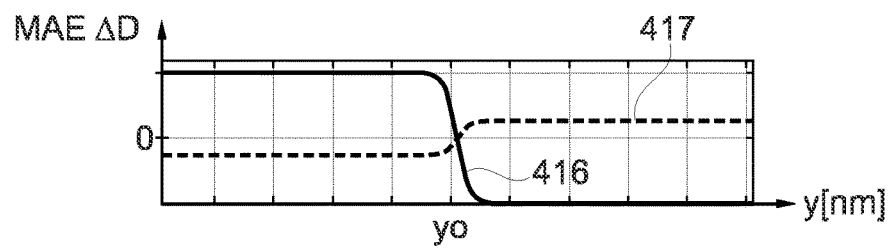
Figure 6D:
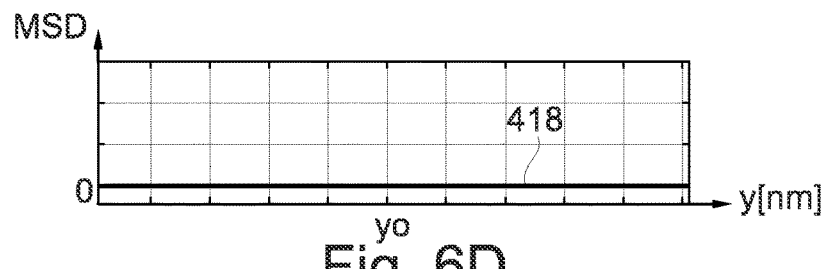
Figure 6E:
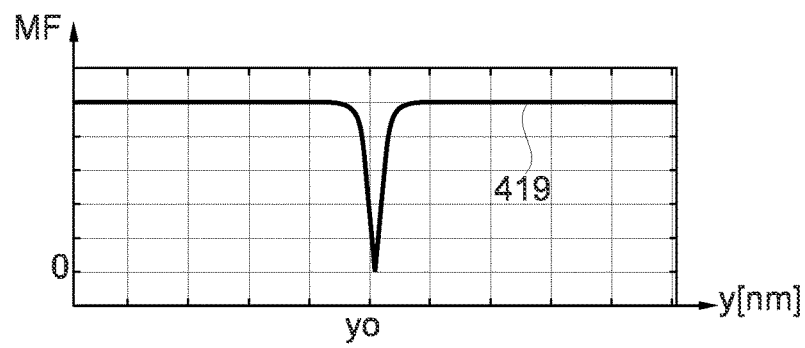

In FIG. 6C line 416 shows the moving average error MAE(y) that is a function of the difference between $z^*(y)$ and MA(y). The MAE(y) may induce a CD variation that depends on the value of $y-y_0$. Line 417 shows an example for a correction dose component $\Delta D(y)$ obtained directly or via a CD variation from the MAE(y). In FIG. 6D line 418 shows the corresponding dynamic error MSD(y) and in FIG. 6E line 409 shows a total moving error or moving focus MF(y) obtained from the square root of the sum of $MSD^2(y)$ and $MAE^2(y)$.

The following Figures illustrate different applications of a method for compensating intra-field focus error induced by device topology, wherein the method may be carried out at the lithographic apparatus 800 of FIG. 1.

Figure 7:
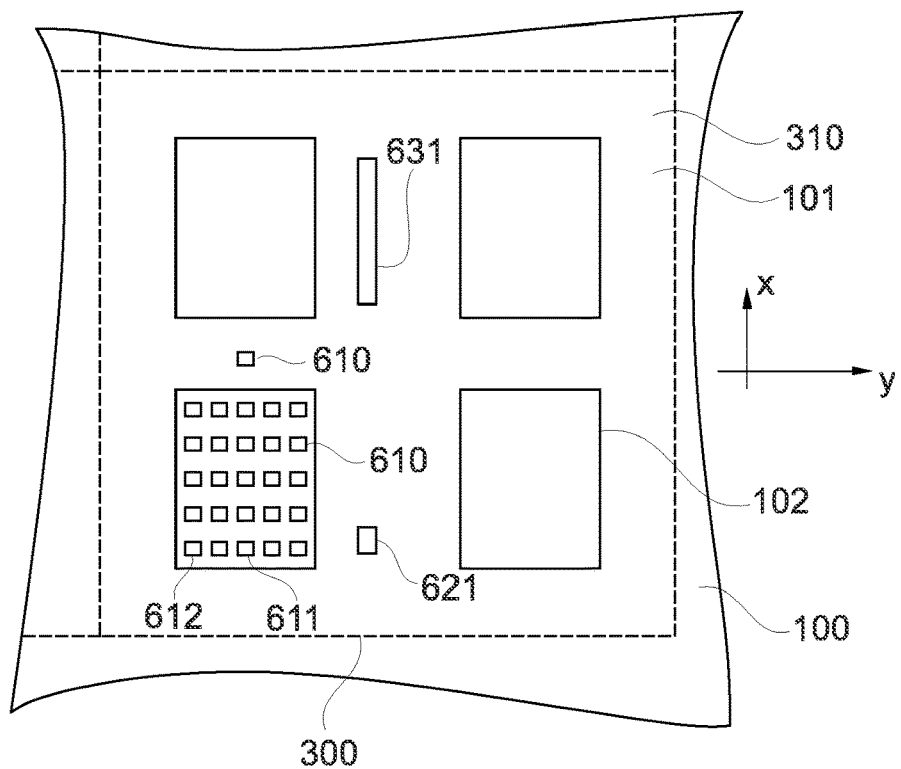
FIG. 7 shows a schematic plan view of an exposure field including various features for discussing effects of the embodiments.

FIG. 7 shows a plan view of a substrate 100 with an exposure field 300 including device portions 310. Each device portion 310 may correspond to a semiconductor device including a 3D-NAND, wherein memory cells are stacked in mesa sections 102 and electric circuits for reading and writing the memory cells are formed in the base section 101. The mesa sections 102 may include a plurality of critical features 610, wherein the critical features 610 may have the same target diameter. The target diameter may represent a critical dimension (CD). For example, the critical features 610 may be HAR (high aspect ratio) features.

The diameters of the critical features 610 are defined by exposing and developing a photosensitive layer formed on a main surface of the substrate 100. The transitions between the base section 101 and the mesa sections 102 effect that each critical feature 610 is exposed with a different focus error, e.g., MAE, MSD or MF, that depends on the distance of the respective critical feature 610 from the transition. Without any further measures, the different focus errors would cause CD differences ΔCD among the critical features 610.

According to an embodiment one of the critical features 610 may be defined as anchor feature 611. For the anchor feature 611, a pre-calibration process may determine a combination of a dose value and a focus value at which a process window for the exposure of the anchor feature 611 is sufficiently wide.

The supplemental controller 893 of FIG. 1 may use the substrate leveling data and/or device-specific layout data to determine a focus error difference between the anchor feature 611 and at least one further critical feature 610, some of the further critical features 610 or all of the other critical features 610. The focus error difference may be the difference between the moving average errors MAE at the positions of the anchor feature 611 and the respective critical feature 610, the difference between the dynamic errors MSD, or the difference between the moving focus errors MF, by way of example.

From the focus error differences the supplemental controller 893 derives dose corrections values that at least partially compensate the differences between the focus errors. The dose corrections locally alter the applied dose during exposure of the substrate 100.

One or more of the critical features 610 may be located in the base section 101. The supplemental controller 893 of FIG. 1 may use the substrate leveling data and/or device-specific layout data to determine a focus error difference between the anchor feature 611 in the mesa section 102 and at least one critical feature 610 in the base section 101 and determines dose correction values that at least partially compensate the difference between the focus errors between the anchor feature 611 and the respective critical feature 610 as described above. A dose difference between critical features 610 at the same y position may be realized by the adjustment unit 825 shown in FIG. 1.

According to other embodiments a feature in the base section 101 may be defined as alternative anchor feature 621, for which a pre-calibration process may determine a combination of a dose value and a focus value at which a process window for the exposure of the alternative anchor feature 621 is sufficiently wide. The alternative anchor feature 621 may have an at least similar shape and/or size as the critical features 610.

The supplemental controller 893 of FIG. 1 may use the substrate leveling data and/or device-specific layout data to determine a focus error difference between the alternative anchor feature 621 in the base section 101 and at least one further critical feature 610 in the mesa section 102 and determines dose correction values that at least partially compensate the difference between the focus errors between the alternative anchor feature 621 and the respective critical feature 610 as described above. In addition, the correction dose component may include a resist-related term that may take into account the effect of different resist thickness above the alternative anchor feature 621 and the respective critical feature 610.

According to further embodiments a pre-calibration process may determine a combination of a dose value and a focus value at which a process window for the exposure of a further alternative anchor feature 631 in the base section 101 is sufficiently wide. The further alternative anchor feature 631 may significantly differ from the critical features 610 in shape and/or size.

The supplemental controller 893 of FIG. 1 may determine dose correction values that at least partially compensate the difference between the focus errors between the alternative anchor feature 621 and the respective critical feature 610 as described above. The correction dose component may further include a resist-related term that takes into account the effect of different resist thickness above the further alternative anchor feature 631 and the respective critical feature 610. In addition, the correction dose component may include a CD-related term that takes into account the effect of the differences between the further alternative anchor feature 631 and the critical features 610 in shape and/or size.

Though the above-described embodiments refer to critical features 610 in the mesa sections 102, the critical features may also be formed in the base section 101, wherein the anchor feature may be formed in the base section 101 or in one of the mesa sections 102. Further, more than one anchor feature may be defined per device portion 310, e.g., a first one in the base section 101 and a second one in one of the mesa sections 102.

Figure 8A:
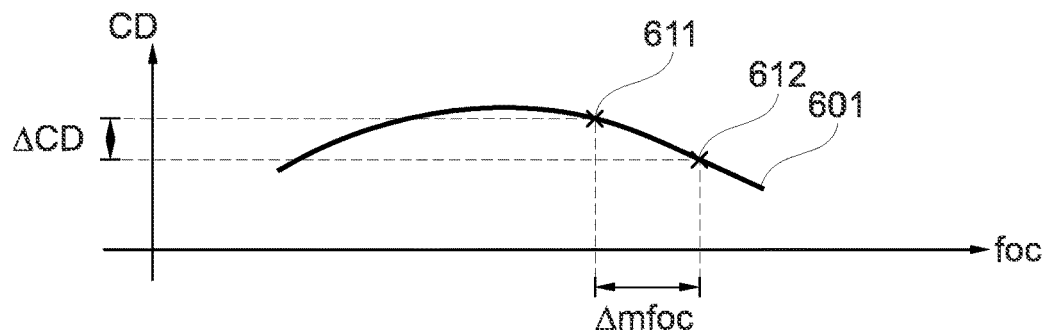
FIGS. 8A-8B show schematic CD/focus and CD/dose diagrams for discussing a method of determining a correction dose component according to an embodiment.
Figure 8B:
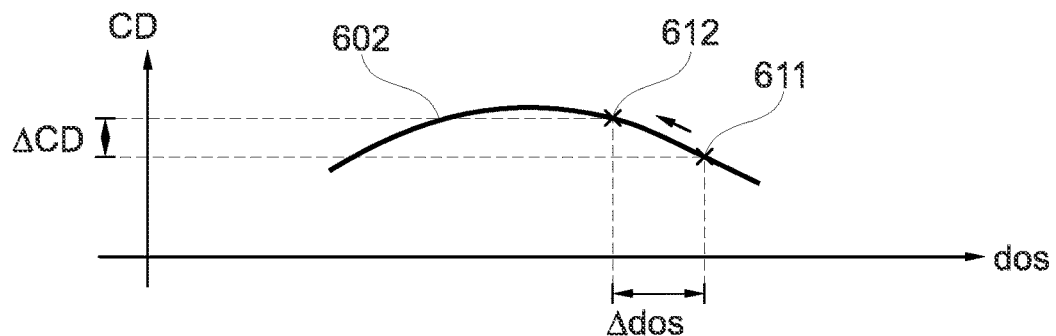

FIGS. 8A-8C illustrate the process of determining the correction dose component. FIGS. 8A-8B serve for explaining the principle. FIG. 8C illustrates the more generic approach.

A CD/focus relationship and a CD/dose relationship of a feature of interest may be obtained by known techniques, e.g., by imaging the feature of interest into exposure fields of an FEM wafer at different combinations of dose and focus and measuring the CDs of the feature of interest in the exposure fields.

The CD/focus relationship may be described by a plurality of two-dimensional arrays. Each two-dimensional array may assign, at a given dose, measured CD values to focus values.

Alternatively, the CD may be expressed by a parametric function giving the CD at a given dose as a function of a focus position, wherein the parametric function is fitted to the measured CD values.

FIG. 8A schematically illustrates a parametric function 601 for the CD/focus data.

The CD/dose relationship may be described by a plurality of two-dimensional arrays assigning, wherein each array assigns, for a given focus value, measured CD values to dose values. Alternatively, the CD may be expressed by a parametric function giving the CD for a given focus as a function of a dose.

FIG. 8B schematically illustrates a parametric function 602 for the CD/dose data.

During exposure of a particular substrate 100, the substrate leveling data and/or device-specific layout data may be used to determine a focus error difference between an anchor feature and a feature of interest. The focus error difference may be obtained from the substrate leveling data obtained from the particular substrate 100, e.g., by the first supplemental unit 894 illustrated in FIG. 1.

The CD/focus data, for example, the parametric function 601 of FIG. 8A may be used to determine the CD difference ΔCD between the anchor feature 611 of FIG. 7 and the feature of interest 612 from the focus error difference between the position of the anchor feature and the position of the feature of interest. The CD/dose data, for example, the parametric function 602 of FIG. 6C may be used to determine a dose correction Δdos that compensates the CD difference ΔCD between the anchor feature 611 and the feature of interest 612.

The correction dose component Δdos may be determined, e.g., by the supplemental controller 893 illustrated in FIG. 1. The correction dose component Δdos at least partly compensates the effect of a residual intra-field defocus caused by device-specific topography on the substrate main surface 110.

Figure 9:
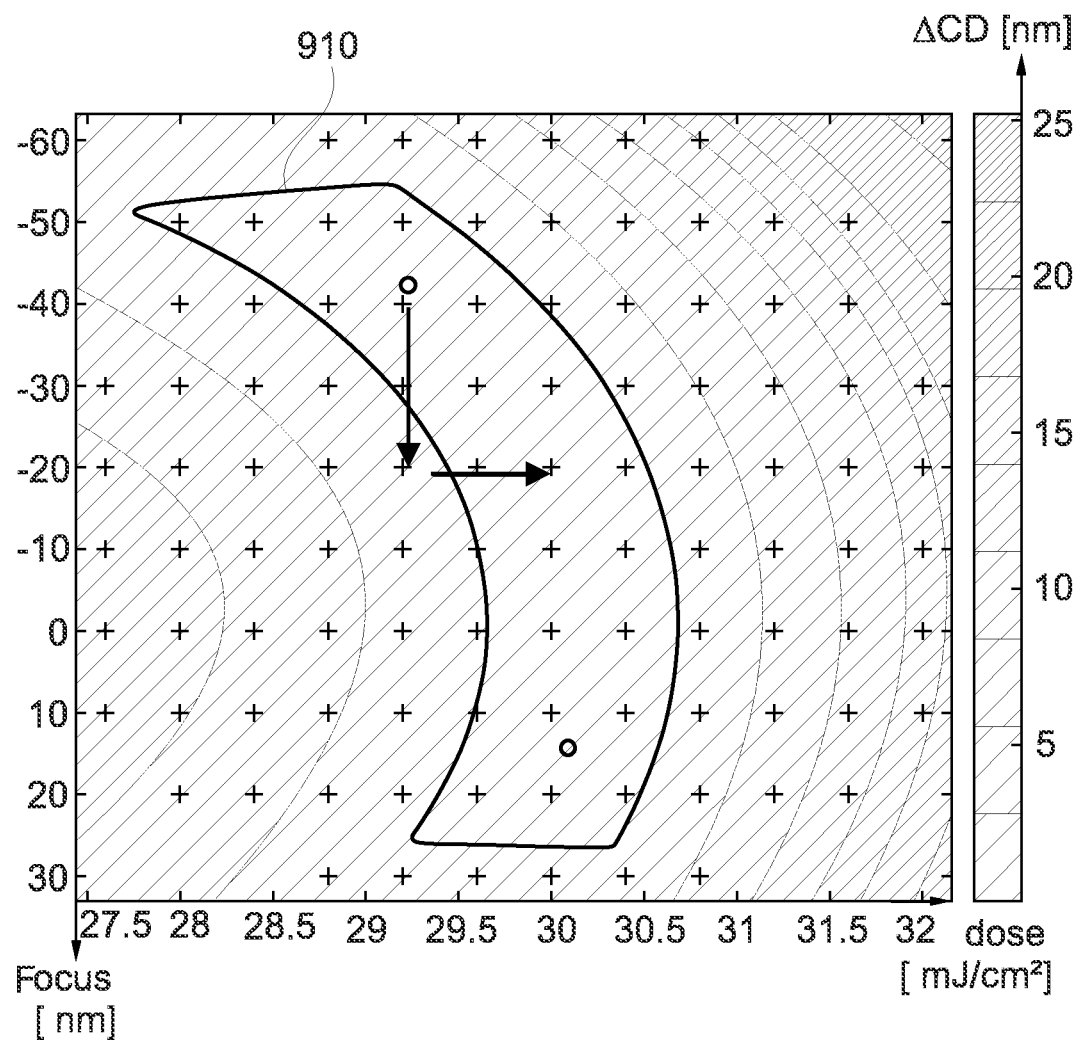
FIG. 9 shows a schematic CD/focus/dose diagram for discussing a method of determining a correction dose component according to another embodiment.

FIG. 9 shows a greyscale map giving the dependencies between a certain CD, focus and dose. The map may be obtained, e.g., from an FEM wafer. Black crosses mark the measurement sites on the FEM wafer. The grey values represent the interpolated deviation of the CD from a target CD. For example, for a dose of 31 mJ/cm$^2$ and a focus of −50 nm the target CD is missed by about 12 nm. The frame 910 indicates the boundary of the allowed process window for the CD. In the illustrated case, the frame indicates the area with a deviation of at most 3 nm from the target CD. The two circles 920 indicate two optimum dose/focus combinations, around which the deviation from the target CD is close to zero.

The vertical arrow indicates the effect of a focus error induced by device-specific topography. For example, the focus error corresponds to a shift of the focus position by 20 nm. The CD may leave the process window. The horizontal arrow indicates that with a dose correction of about 1 mJ/cm$^2$ the CD value can be shifted back into the process window.

In other words, the dose correction may be selected such that for the given focus error a CD deviation of at most 3 nm is achieved. For example, the dose correction is selected such that the least possible CD deviation for the given focus is achieved.

What is claimed is:

1. An exposure method, comprising:
   providing a substrate and a photosensitive layer on a main surface of the substrate, wherein the substrate comprises a base section and a mesa section, wherein in the base section the main surface is in a base plane and wherein the mesa section protrudes from the base plane;
   scanning the photosensitive layer with a radiation beam having a beam axis along a z-direction that is orthogonal to the base plane; and
   controlling a local dose applied to a partial area of the photosensitive layer by the radiation beam, wherein the local dose includes a base dose component and a correction dose component, the correction dose component is a function of a distance between the partial area and a transition between the base section and the mesa section, wherein the correction dose component at least partly compensates an effect of a defocus resulting from a height difference between the mesa section and the base section on a critical dimension in the partial area, wherein a horizontal cross-sectional area of the radiation beam has a longitudinal axis perpendicular to the transition, the radiation beam scans the main surface along a scan direction parallel to the transition, wherein controlling the local dose comprises modifying a radiation intensity in the radiation beam along the longitudinal axis, and wherein the scan direction and the longitudinal axis are perpendicular to the beam axis.

2. The exposure method according to claim 1, wherein the base dose component is selected to compensate for at least one of intra-field exposure variations and inter-field exposure variations.

3. The exposure method according to claim 1, wherein the radiation beam scans the main surface along the scan direction perpendicular to the transition, the radiation beam is obtained from a pulsed radiation source, and wherein controlling the local dose comprises varying a pulse rate of the radiation source.

4. The exposure method according to claim 1, further comprising:
   a leveling control compensating process-induced height deviations of the main surface on a focal position of the radiation beam by moving the substrate along the z-direction orthogonal to the base plane.

5. The exposure method according to claim 4, wherein the leveling control takes into account the height difference between the mesa section and the base section.

6. The exposure method according to claim 4, wherein the leveling control ignores the height difference between the mesa section and the base section.

7. The exposure method according to claim 4, wherein a spatial frequency of the process-induced height deviations is lower than a spatial frequency of the mesa sections.

8. The exposure method according to claim 1, further comprising:
   determining CD/focus/dose data, wherein the CD/focus/dose data contains CD values of the critical feature for a plurality of focus values at different dose values; and
   determining the correction dose component of the local dose by obtaining, from the CD/focus/dose data, a dose value that causes a CD deviation that at least partly compensates a CD deviation caused by the defocus resulting from the height difference between the mesa section and the base section.

9. The exposure method according to claim 1, wherein information about the defocus resulting from the height difference between the mesa section and the base section is obtained from substrate leveling data obtained by a level sensor unit and/or layout-topography data.

10. A lithographic apparatus, comprising:
    a substrate stage configured to hold a substrate with device-specific topology comprising a base section and a mesa section;
    a scanner unit configured to scan a photosensitive layer formed on a main surface of a substrate in a scan direction with an illumination beam having a beam axis that is perpendicular to the surface of the substrate stage, wherein the substrate is held on a surface of the substrate stage;
    a supplemental controller configured to determine a correction dose component of a local dose applied by the illumination beam to a partial area of the photosensitive layer, wherein the correction dose component is a function of a distance between the partial area and a transition between the base section and the mesa section, and wherein the correction dose component at least partly compensates an effect of a defocus resulting from a height difference between the mesa section and the base section on a critical dimension in the partial area;
    a main controller configured to control the local dose applied by the radiation beam to the partial area, wherein the main controller is configured to obtain the local dose from the correction dose component and a base dose component; and an adjustment unit configured to modulate a horizontal intensity distribution in the illumination beam at least along a longitudinal axis of a rectangular cross-sectional area, wherein the main controller is configured to control the local dose by controlling the adjustment unit, and wherein the scan direction and the longitudinal axis are perpendicular to the beam axis.

11. The lithographic apparatus according to claim 10, wherein the base dose component is selected to compensate for at least one of intra-field exposure variations and inter-field exposure variations.

12. The lithographic apparatus according to claim 10, further comprising:
   a radiation source configured to emit pulsed radiation; and
   an illumination unit configured to collimate the radiation emitted by the radiation source to form the illumination beam with the rectangular cross-sectional area.

13. The lithographic apparatus according to claim 10, further comprising:
   a radiation source configured to emit pulsed radiation; and
   an illumination unit configured to collimate the radiation emitted by the radiation source to form the illumination beam;
   wherein the main controller is configured to control the local dose by controlling a pulse rate of the radiation source.

14. The lithographic apparatus according to claim 10, further comprising:
   a leveling controller configured to compensate process-induced height deviations of the main surface on a focal position of the radiation beam by controlling the substrate stage to move along the beam axis of the radiation beam.

15. The lithographic apparatus according to claim 14, further comprising:
   the leveling controller unit is configured to take into account height information of device-specific topology of the substrate held by the substrate stage.

16. The lithographic apparatus according to claim 14, further comprising:
   the leveling controller is configured to ignore height information of device-specific topology of the substrate held by the substrate stage.

17. The lithographic apparatus according to claim 10, wherein the supplemental controller unit is configured to receive information about the defocus resulting from the device-specific topology from substrate leveling data obtained by a level sensor unit.

18. The lithographic apparatus according to claim 10, wherein the supplemental controller unit is configured to hold CD/focus/dose data, wherein the CD/focus/dose data contains CD values of the critical feature for a plurality of different focus values at different dose values, and is further configured to determine the correction dose component by selecting, from the CD/focus/dose data, a dose value that causes a CD deviation that at least partly compensates a CD deviation caused by the defocus resulting from the device-specific topology.

* * * * *